(12) United States Patent
Zhang et al.

(10) Patent No.: US 10,746,760 B2
(45) Date of Patent: Aug. 18, 2020

(54) METHOD FOR MOVING AND TRANSFERRING NANOWIRES USING TAPERED HAIR OF DIAMETER ON MICRON RANGE

(71) Applicant: Dalian University of Technology, Dalian, Liaoning Province (CN)

(72) Inventors: Zhenyu Zhang, Dalian (CN); Junfeng Cui, Dalian (CN); Bo Wang, Dalian (CN); Dongming Guo, Dalian (CN)

(73) Assignee: DALIAN UNIVERSITY OF TECHNOLOGY, Dalian, Liaoning (CN)

( * ) Notice: Subject to any disclaimer, the term of this patent is extended or adjusted under 35 U.S.C. 154(b) by 19 days.

(21) Appl. No.: 16/339,907

(22) PCT Filed: Nov. 15, 2017

(86) PCT No.: PCT/CN2017/111168
§ 371 (c)(1),
(2) Date: Apr. 5, 2019

(87) PCT Pub. No.: WO2019/090799
PCT Pub. Date: May 16, 2019

(65) Prior Publication Data
US 2020/0081033 A1    Mar. 12, 2020

(30) Foreign Application Priority Data

Nov. 9, 2017  (CN) .......................... 2017 1 1094075

(51) Int. Cl.
*G01Q 60/10* (2010.01)
*G01Q 30/02* (2010.01)
*B82B 3/00* (2006.01)

(52) U.S. Cl.
CPC ............. *G01Q 60/10* (2013.01); *G01Q 30/02* (2013.01); *B82B 3/0076* (2013.01)

(58) Field of Classification Search
CPC ....... G01Q 60/10; G01Q 30/02; B82B 3/0076
See application file for complete search history.

(56) References Cited

FOREIGN PATENT DOCUMENTS

| CN | WO 0070325 A1 | 11/2000 |
|----|---------------|---------|
| CN | 1689961 A     | 11/2005 |

(Continued)

*Primary Examiner* — Nicole M Ippolito
*Assistant Examiner* — Hanway Chang
(74) *Attorney, Agent, or Firm* — Muncy, Geissler, Olds & Lowe, P.C.

(57) ABSTRACT

The present invention provides a method for moving and transferring nanowires using tapered hair of diameter in micron range. The nanowires have a diameter of 60-150 nm. The tapered hair has a diameter of 1-100 μm, a tip curvature radius of 0.8-3 μm and a length of 4-10 mm. A plastic film on a copper grid used for a TEM is removed, the copper grid is reserved, and holes have a diameter of 50-100 μm. The copper grid after ultrasonic cleaning gains the nanowires from the acetone liquid with ultrasonic dispersed nanowires. The copper grid with distributed nanowires and the tapered hair are respectively placed on mobile platforms of two different optical microscopes. Millimeter movement and micron movement of the tapered hair are realized, thereby realizing movement and transfer operation for the nanowires. The tip of the tapered hair is dipped in a small drop of conductive silver epoxy, and the conductive silver epoxy is respectively dropped on both ends of the nanowires; and the radius of the dropped conductive silver epoxy is 4-8 μm. The present invention realizes a method for moving and transferring nanowires using tapered hair through the mobile platforms of the two optical microscopes.

1 Claim, 1 Drawing Sheet

(56) References Cited

FOREIGN PATENT DOCUMENTS

| | | |
|---|---|---|
| CN | 101039870 A | 9/2007 |
| CN | 101949957 A | 1/2011 |
| CN | 107219243 A | 9/2017 |
| WO | WO 2016112171 A1 | 7/2016 |

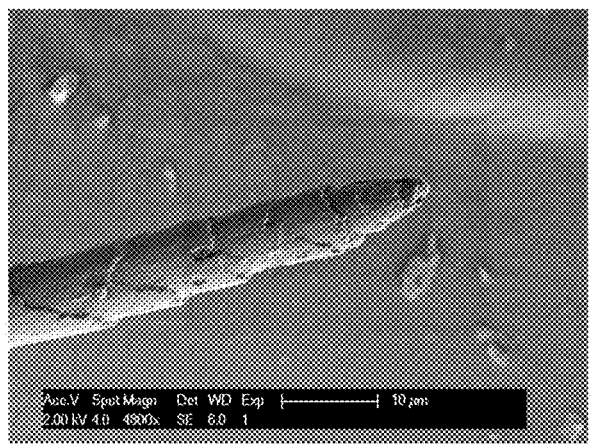
Fig. 1
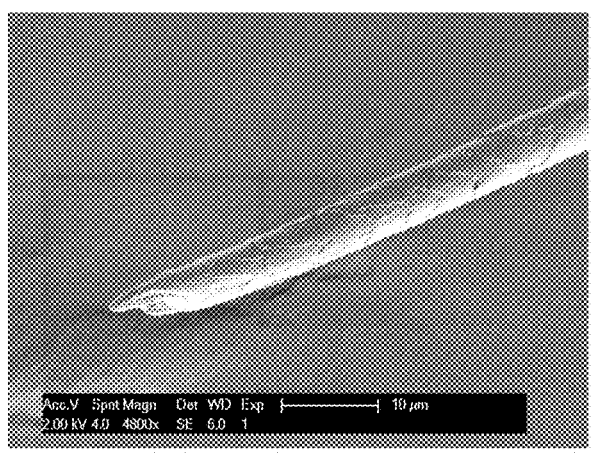
Fig. 2
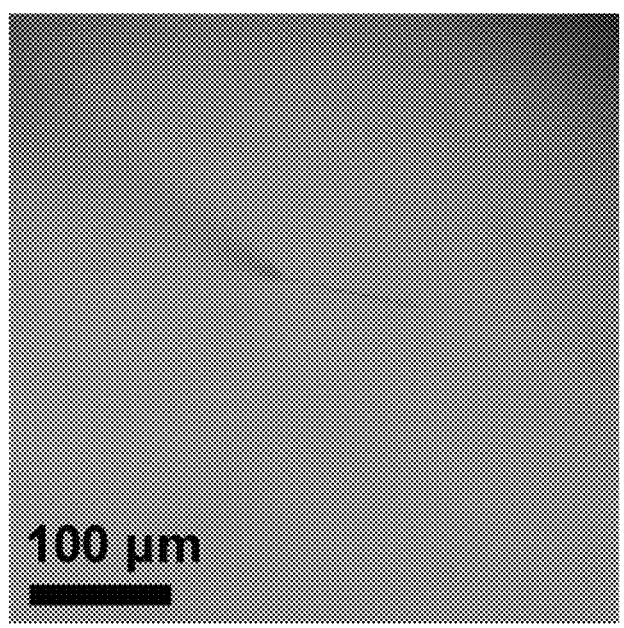
Fig. 3 (Fig.3 as an illustration in Abstract)

METHOD FOR MOVING AND TRANSFERRING NANOWIRES USING TAPERED HAIR OF DIAMETER ON MICRON RANGE

TECHNICAL FIELD

A method for moving and transferring nanowires using tapered hair of diameter in micron range relates to movement, transfer and fixation of nanowires, has an important influence on subsequent tests and representation, and particularly relates to in-situ nanomechanical tests and representation of a scanning electron microscope (SEM) and a TEM.

BACKGROUND

High-performance equipment requires the surfaces of high-performance parts to have nano-level planarity and subnano-level roughness. This harsh ultra-precision machining requirement is close to the limit of physical machining, which needs to be satisfied by developing new ultra-precision machining technologies and equipment. The nano-precision surface manufacturing method is an effective method to satisfy this harsh machining requirement. To develop the new nano-precision surface manufacturing technologies and methods, it is necessary to study an atomic-dimension damage generation and evolution mechanism, a material removal mechanism and a stress-induced damage formation mechanism. In-situ TEM nanomechanics is a scientific method to study the basic principle. In the past, due to the limitation of experimental conditions, it is difficult to conduct in-situ TEM nanomechanical test and representation. One of the important reasons is that the operation of cutting, welding, transferring and moving nanowires by focused ion beams and electron beams will cause pollution and damage to the nanowires. When the nanowires are fixed by the two methods, chemical vapor deposition or physical vapor deposition is generally adopted, which is easy to pollute the nanowires, so that subsequent in-situ test and representation are significantly affected, or even cannot be carried out, and it is also difficult to obtain atomic-demension high-resolution TEM images. In addition, in the process of moving and transferring the nanowires by the two methods, it is easy to produce defects such as cavity, interstitial atom, stacking fault and dislocation ring in the nanowires, which makes it difficult for the SEM and TEM images obtained at micro-nano scale to extend to macroscopic materials.

To eliminate the pollution and the damage to the nanowires caused by the traditional focused ion beams and electron beams in the process of moving, transferring, cutting, welding and fixing the nanowires, it is urgent to develop a novel method of moving, transferring and fixing the nanowires for bringing convenience for subsequent in-situ SEM and TEM nanomechanical test and representation, thereby eliminating the pollution and the damage caused by the operation for the nanowires by the traditional focused ion beams and electron beams.

SUMMARY

The present invention adopts a method for moving and transferring nanowires using tapered hair of diameter in micron range, realizing movement and transfer of nanowires using tapered hair.

The present invention adopts the following technical solution:

A method for moving and transferring nanowires using tapered hair of diameter in micron range is provided. The nanowires have a diameter of 60-150 nm. The tapered hair comprises human eyebrow, eyelash, yellow weasel's hair and goat hair, and has a diameter range of 1-100 μm, a tip curvature radius of 0.8-3 μm and a length of 4-10 mm. A plastic film on a copper grid used for a TEM is burned with fire, the copper grid is reserved, and the diameter of the holes is 50-100 μm. Then, the copper grid after ultrasonic cleaning gains the nanowires from the acetone liquid with ultrasonic dispersed nanowires. The copper grid with nanowires and the tapered hair are respectively placed on mobile platforms of two different optical microscopes. Millimeter movement and micron movement of the tapered hair are realized, thereby realizing movement and transfer operation for the nanowires. The tip of the tapered hair is dipped in a small drop of conductive silver epoxy, and the conductive silver epoxy is respectively dropped on both ends of the nanowires; and the radius of the dropped conductive silver epoxy is 4-8 μm. The present invention provides a method for moving and transferring nanowires using tapered hair with diameter in micron range through mobile platforms of two optical microscopes.

The nanowires have a diameter of 60-150 nm. If the diameter of the nanowires is greater than 150 nm, an electron beam is difficult to penetrate through the nanowires and is difficult to obtain a high-resolution TEM micrograph of atomic dimension. If the diameter of the nanowires is less than 60 nm, it is very difficult to operate and seek under the optical microscopes. The diameter range of the nanowires is selected as 60-150 nm after comprehensive consideration of operation and atomic imaging.

The tapered hair comprises human eyebrow, eyelash, yellow weasel's hair and goat hair, and has a diameter of 1-100 μm, a tip curvature radius of 0.8-3 μm and a length of 4-10 mm. The four kinds of materials are obtained relatively easily, and come from human bodies and Chinese brush pens. Furthermore, the hairs are tapered, and are beneficial for operating the nanowires. The diameter range of the four kinds of hairs is 1-100 μm, which is convenient for accurately operating the nanowires. The tapered hair is easy for oblique insertion into the lower part of the nanowires under the optical microscope, thereby realizing the operation for the nanowires. The tip curvature radius is 0.8-3 μm, which is beneficial for utilization of electrostatic attraction between the tapered hair and the nanowires. The length is 4-10 mm in order to ensure that the tapered hair has certain rigidity and flexibility, thereby realizing operation and transfer for the nanowires.

A plastic film on a copper grid used for a TEM is burned with fire, the copper grid is reserved, and the diameter of the holes is 50-100 μm. To transfer the nanowires, the tapered hair shall be inserted into the lower part of the nanowires, so that the nanowires are moved, extracted and transferred relatively accurately. Therefore, a layer of plastic film that covers the copper grid needs to be removed. Because the plastic film is very thin, the plastic film can be quickly removed by a burning method, which is very clean and may not cause pollution to subsequent operation. Because the length of the nanowires is generally in micron range, the diameter of the holes of the copper grid is selected as 50-100 μm, so that the nanowires can be placed and will not fall into the holes of the copper grid.

Ultrasonic dispersion is conducted on the nanowires in acetone for 1-2 min. The acetone has strong decontamination and dispersion capabilities, and has more obvious effect by means of the ultrasonic action. Therefore, ultrasonic dispersion is conducted with the acetone for a short time of 1-2 min.

The copper grid is clamped with tweezers and is subjected to ultrasonic cleaning in an acetone solution for 0.5-1 min; then, the copper grid after ultrasonic cleaning gains the nanowires from the acetone liquid with ultrasonic dispersed nanowires; and after the acetone solution evaporates, the nanowires are distributed on the surface of the copper grid. The copper grid is clamped with the tweezers and is subjected to ultrasonic cleaning in the acetone so as to clean traces and pollution left by burning the copper grid. The cleaned copper grid gains the nanowires from the acetone solution with diffused nanowires, so as to reserve more uniformly distributed nanowires on the copper grid.

The copper grid with distributed nanowires and the tapered hair are respectively placed on mobile platforms of two different optical microscopes. The tapered hair is bonded to the tip of a tapered rod with conductive silver epoxy; and a flat end is fixed to the mobile platform of the microscope with the conductive silver epoxy. The copper grid is placed on the mobile platform of the optical microscope, and the optical microscope is used to seek and operate the nanowires. The tapered hair is connected with the mobile platform of another optical microscope. Macroscopic and microscopic movement functions of the mobile platform of another optical microscope are mainly used to realize accurate movement, extraction and transfer operation for the nanowires. The millimeter-micron combined movement function of another optical microscope is used to realize the operation for the nanowires.

Millimeter movement and micron movement of the tapered hair are realized through coarse control and fine control knobs of the mobile platform of the optical microscope, thereby realizing movement and transfer operation for the nanowires. A coarse control knob of the optical microscope is mainly used to realize rapid millimeter movement of the tapered hair, and a fine control knob is used to realize micron movement of the tapered hair, thereby realizing the operation for the nanowires.

The nanowires are observed in the optical microscope in which the copper grid is placed; movement and transfer operation is conducted by means of the tapered hair; the copper grid is replaced with an in-situ mechanical test micro apparatus used for an SEM or a TEM; the nanowires are placed in a proper position on the micro apparatus; the tip of the tapered hair is dipped in a small drop of conductive silver epoxy, and the conductive silver epoxy is respectively dropped on both ends of the nanowires; and the radius of the dropped conductive silver epoxy is 4-8 µm. The nanowires are found under the optical microscope and are focused. The mobile platform of another optical microscope is used to realize oblique insertion of the tapered hair into the lower part of the nanowires. The nanowires are lifted so that the electrostatic attraction between the nanowires and the copper grid is decreased. Then, the nanowires are extracted to leave the surface of the copper grid through the electrostatic attraction between the tapered hair and the nanowires. The copper grid is replaced with an in-situ mechanical test micro apparatus of the SEM or TEM, and the nanowires are placed in the tension position. The tip of the tapered hair is dipped in a drop of conductive silver epoxy which is slightly dropped on one end of the nanowires, and is dipped in another small drop of conductive silver epoxy which is dropped on the other end. The size radius of the dropped conductive silver epoxy is 4-8 µm. The nanowires are not polluted, and also have good bonding strength after solidification.

After 2-4 h in the air, the conductive silver epoxy is solidified to conduct in-situ nanomechanical test and representation of the SEM or the TEM. After standing in the air for 2-4 h, the conductive silver epoxy is solidified. The nanowires are firmly fixed to the micro apparatus without physical and chemical vapor deposition pollution and damage to the nanowires caused by ion beams and electron beams, so as to conduct in-situ nanomechanical test and representation of the SEM or the TEM.

The present invention has the effects and the benefits that the movement and the transfer of the nanowires are realized using the tapered hair of diameter in micron range; and the nanowires are fixed through the conductive silver epoxy, thereby avoiding pollution and damage caused by the operation for the nanowires by traditional focused ion beams and electron beams.

DESCRIPTION OF DRAWINGS

FIG. 1 is an SEM micrograph of tapered goat hair of diameter in micron range.

FIG. 2 is an SEM micrograph of tapered yellow weasel's hair of diameter in micron range.

FIG. 3 is an optical micrograph of transferring nanowires with yellow weasel's hair under an optical microscope.

DETAILED DESCRIPTION

Specific embodiments of the present invention are further described below in combination with accompanying drawings and the technical solution.

A method for moving and transferring nanowires using tapered hair of diameter in micron range realizes movement and transfer of nanowires using tapered hair, wherein:

(1) the nanowires have a diameter of 60-150 nm;

(2) the tapered hair comprises human eyebrow, eyelash, yellow weasel's hair and goat hair, and has a diameter of 1-100 µm, a tip curvature radius of 0.8-3 µm and a length of 4-10 mm;

(3) a plastic film on a copper grid used for a TEM is burned with fire, the copper grid is reserved, and holes have a diameter of 50-100 µm;

(4) ultrasonic dispersion is conducted on the nanowires in acetone for 1-2 min;

(5) the copper grid is clamped with tweezers and is subjected to ultrasonic cleaning in an acetone solution for 0.5-1 min; then, the copper grid after ultrasonic cleaning gains the nanowires from the acetone liquid with ultrasonic dispersed nanowires; after the acetone solution evaporates, the nanowires are distributed on the surface of the copper grid;

(6) the copper grid with nanowires and the tapered hair are respectively placed on mobile platforms of two different optical microscopes. The tapered hair is bonded to the tip of a tapered rod with conductive silver epoxy; and a flat end is fixed to the mobile platform of the microscope with the conductive silver epoxy;

(7) millimeter movement and micron movement of the tapered hair are realized through coarse control and fine control knobs of the mobile platform of the optical microscope, thereby realizing movement and transfer operation for the nanowires;

(8) the nanowires are observed in the optical microscope in which the copper grid is placed; movement and transfer operation is conducted by means of the tapered hair; the copper grid is replaced with an in-situ mechanical test micro apparatus used for an SEM or a TEM; the nanowires are placed in a test position on the micro apparatus; the tip of the tapered hair is dipped in a small drop of conductive silver epoxy, and the conductive silver epoxy is respectively dropped on both ends of the nanowires; and the radius of the dropped conductive silver epoxy is 4-8 µm;

(9) after 2-4 h in the air, the conductive silver epoxy is solidified to conduct in-situ nanomechanical test and representation of the SEM or the TEM.

Embodiments

SiC single crystal nanowires with a diameter of 80-100 nm are selected as the operation objects. Human eyebrow and goat hair in the Chinese brush pen of goat hair (shown in FIG. 1) and yellow weasel's hair in the Chinese brush pen of yellow weasel's hair (shown in FIG. 2) are respectively used as tapered hairs of diameter in micron range. The three kinds of tapered hairs have a diameter range of 2-100 µm, a tip curvature radius of 1-3 µm and a length of 6-10 mm. A 200-mesh copper grid having a plastic film and a diameter of 3 mm and used for preparing a TEM sample is selected. The plastic film on the copper grid is burned with a cigarette lighter to expose through holes in the copper grid which have a diameter of 90-100 µm. Ultrasonic dispersion is conducted on the nanowires in acetone for 1.5-2 min. The copper grid without the film is clamped with tweezers and is subjected to ultrasonic cleaning in the acetone solution for 40-60 s to remove traces and pollution after burning. Then, the copper grid is taken out. The copper grid is clamped with the tweezers to gain the nanowires from the acetone solution of dispersed nanowires. The nanowires are put in the air. After acetone evaporates, the nanowires are distributed on the copper grid. The copper grid with the nanowires is placed on the mobile platform of the optical microscope. The tapered hair of diameter in micron range is bonded to the tip of a tapered plastic slender rod with conductive silver epoxy; and the other end is burned with fire into a flat end and is fixed to the mobile platform of another optical microscope with the conductive silver epoxy. The nanowires are found from the eyepiece of the optical microscope and are focused clearly. Millimeter movement and micron movement of the tapered hair of diameter in micron range are realized using the mobile platform of another optical microscope in combination with coarse control and fine control, and the nanowires are gradually obliquely inserted into the lower part of the nanowires using the tapered hair. After the nanowires are inserted, upward micron movement of the tapered hair is realized through the fine control knob of the mobile platform, and one end of the nanowires is lifted to leave the copper grid. After one end of the nanowires is lifted, the electrostatic attraction between the nanowires and the copper grid is gradually decreased with the decrease of the contact area. Finally, only one point of one end comes into contact; and the tapered hair is continuously moved upwards, so that the nanowires leave the copper grid, as shown in FIG. 3, thereby realizing movement, extraction and transfer operation for the nanowires through the tapered hair of diameter in micron range. After the nanowires leave the copper grid, a test micro apparatus for the SEM or TEM is placed in the position of the copper grid. Focusing is conducted under the optical microscope, so that the positions for placing the nanowires are clear. Then, micron range successive approximation of the nanowires is realized through the fine control knob using the mobile platform of another optical microscope. One end of the nanowires is placed in the test position of the micro apparatus. Then, the nanowires are kept flat gradually using the fine control function of micro movement. In this way, as the contact area between the nanowires and the micro apparatus is gradually increased, the electrostatic attraction therebetween is also gradually increased. After the nanowires are kept flat, the tapered hair can be moved backwards, so that the tapered hair is separated from the nanowires, thereby realizing the transfer operation for the nanowires. Subsequently, a drop of conductive silver epoxy is dropped on the mobile platform of the micro apparatus. The tip of the tapered hair is dipped in a small drop of conductive silver epoxy, and the conductive silver epoxy is accurately dropped on one end of the nanowires through the mobile platform, so that the conductive silver epoxy comes into contact with one end of the nanowires and the conductive silver epoxy drops. This operation is repeated, and a small drop of conductive silver epoxy is dropped on the other end of the nanowires. The radius of the dropped conductive silver epoxy is 5-8 µm. The conductive silver epoxy stands in the air for 3-4 h to realize solidification.

The solidified micro apparatus is placed in the in-situ mechanical test system of PI 95 TEM PicoIndenter. The system is inserted into FEI Tecnai F20 FETEM to conduct the TEM nanomechanical tension test. Operation voltage of the TEM is 200 kV. A displacement control mode is used; loading rate is 10 nm/s; and tension load is exerted to the nanowires. The nanowires have a diameter of 80-100 nm. The fractured force during fracture is 110 µN, and the fracture strength of the nanowires is 12 GPa. The dynamic tension process of the nanowires is recorded as a video by the in-situ mechanical test system. Key atomic-dimension high-resolution TEM images during fracture can be extracted from the video, thereby realizing in-situ TEM mechanical tension test and representation experiment of the nanowires.

We claim:

1. A method for moving and transferring nanowires using tapered hair of diameter in micron range, realizing movement and transfer of nanowires using tapered hair, wherein:
   (1) the nanowires have a diameter of 60-150 nm;
   (2) the tapered hair comprises human eyebrow, eyelash, yellow weasel's hair and goat hair, and has a diameter of 1-100 µm, a tip curvature radius of 0.8-3 µm and a length of 4-10 mm;
   (3) a plastic film on a copper grid used for a TEM is removed, the copper grid is reserved, and holes on the copper grid have a diameter of 50-100 µm;
   (4) ultrasonic dispersion is conducted on the nanowires in acetone for 1-2 min;
   (5) the copper grid is clamped with tweezers and is subjected to ultrasonic cleaning in an acetone solution for 0.5-1 min; then, the copper grid after ultrasonic cleaning gains the nanowires from the acetone liquid with ultrasonic dispersed nanowires; after the acetone solution evaporates, the nanowires are distributed on the surface of the copper grid;
   (6) the copper grid with distributed nanowires and the tapered hair are respectively placed on mobile platforms of two different optical microscopes; the tapered hair is bonded to the tip of a tapered rod with conductive silver epoxy; a flat end is fixed to the mobile platform of the microscope with the conductive silver epoxy;
   (7) millimeter movement and micron movement of the tapered hair are realized through coarse control and fine control knobs of the mobile platform of the optical microscope, thereby realizing movement and transfer operation for the nanowires;

(8) the nanowires are observed in the optical microscope in which the copper grid is placed; movement and transfer operation is conducted by means of the tapered hair; the copper grid is replaced with an in-situ mechanical test micro apparatus used for a scanning electron microscope or a TEM; the nanowires are placed in a test position on the in-situ mechanical test micro apparatus; the tip of the tapered hair is dipped in the conductive silver epoxy, and the conductive silver epoxy is respectively dropped on both ends of the nanowires; the radius of the dropped conductive silver epoxy is 4-8 µm;

(9) after 2-4 h in the air, the conductive silver epoxy is solidified to conduct in-situ nanomechanical test and representation of the SEM or the TEM.

\* \* \* \* \*